United States Patent
Hampden-Smith et al.

(10) Patent No.: US 8,372,472 B2
(45) Date of Patent: Feb. 12, 2013

(54) FORMING PHOTOVOLTAIC CONDUCTIVE FEATURES FROM MULTIPLE INKS

(75) Inventors: Mark J. Hampden-Smith, Albuquerque, NM (US); Mark H. Kowalski, Albuquerque, NM (US)

(73) Assignee: Cabot Corporation, Boston, MA (US)

( * ) Notice: Subject to any disclaimer, the term of this patent is extended or adjusted under 35 U.S.C. 154(b) by 0 days.

(21) Appl. No.: 13/349,732

(22) Filed: Jan. 13, 2012

(65) Prior Publication Data

US 2012/0115275 A1  May 10, 2012

Related U.S. Application Data

(62) Division of application No. 11/952,580, filed on Dec. 7, 2007, now Pat. No. 8,101,231.

(51) Int. Cl.
| | |
|---|---|
| B05D 5/12 | (2006.01) |
| B05D 5/00 | (2006.01) |
| B05D 3/06 | (2006.01) |
| H01L 31/00 | (2006.01) |
| H01L 21/00 | (2006.01) |
| H01B 13/00 | (2006.01) |

(52) U.S. Cl. ....... 427/75; 427/275; 427/372.2; 427/558; 136/261; 216/17; 438/72; 438/98

(58) Field of Classification Search ............... 427/74–75, 427/275, 372.2, 558; 136/243–265; 216/17–18; 438/57–98
See application file for complete search history.

(56) References Cited

U.S. PATENT DOCUMENTS

| | | | |
|---|---|---|---|
| 3,957,694 A | 5/1976 | Bolon et al. | |
| 4,051,074 A | 9/1977 | Asada | |
| 4,388,346 A | 6/1983 | Bickler | |
| 4,487,811 A | 12/1984 | Eichelberger et al. | |
| 4,594,311 A | 6/1986 | Frisch et al. | |
| 4,697,041 A | 9/1987 | Okaniwa et al. | |
| 4,746,838 A | 5/1988 | Kay | |
| 5,037,876 A | 8/1991 | Birkle et al. | |
| 5,132,248 A | 7/1992 | Drummond et al. | |
| 5,167,271 A | 12/1992 | Lange et al. | |
| 5,421,909 A | 6/1995 | Ishikawa et al. | |
| 5,439,514 A | 8/1995 | Kashiwazaki et al. | |
| 5,661,041 A | 8/1997 | Kano | |
| 5,814,683 A | 9/1998 | Branham | |

(Continued)

FOREIGN PATENT DOCUMENTS

| | | |
|---|---|---|
| EP | 0930641 | 7/1999 |
| EP | 2270872 | 5/2001 |

(Continued)

OTHER PUBLICATIONS

Teng, et al., Liquid Ink Jet Printing with MOD Inks for Hybrid Microcircuits, IEEE Transactions on Components, Hybrids, and Manufacturing Technology, vol. CHMT-12. No. 4. Dec. 1987.

(Continued)

Primary Examiner — James Lin

(57) ABSTRACT

Photovoltaic conductive features and processes for forming photovoltaic conductive features are described. The process comprises (a) providing a substrate comprising a passivation layer disposed on a silicon layer; (b) depositing a surface modifying material onto at least a portion of the passivation layer; (c) depositing a composition comprising at least one of metallic nanoparticles comprising a metal or a metal precursor to the metal onto at least a portion of the substrate; and (d) heating the composition such that it forms at least a portion of a photovoltaic conductive feature in electrical contact with the silicon layer, wherein at least one of the composition or the surface modifying material etches a region of the passivation layer. When the surface modifying material is a UV-curable material, the process comprises the additional step of curing the UV-curable material.

26 Claims, 1 Drawing Sheet

U.S. PATENT DOCUMENTS

| | | | |
|---|---|---|---|
| 5,882,722 | A | 3/1999 | Kydd |
| 6,080,928 | A | 6/2000 | Nakagawa |
| 6,159,267 | A | 12/2000 | Hampden-Smith et al. |
| 6,165,247 | A | 12/2000 | Kodas et al. |
| 6,184,457 | B1 | 2/2001 | Tsuzuki et al. |
| 6,187,157 | B1 | 2/2001 | Chen et al. |
| 6,268,014 | B1 | 7/2001 | Eberspacher et al. |
| 6,274,412 | B1 | 8/2001 | Kydd et al. |
| 6,277,169 | B1 | 8/2001 | Hampden-Smith et al. |
| 6,303,192 | B1 | 10/2001 | Annapragada et al. |
| 6,316,100 | B1 | 11/2001 | Kodas et al. |
| RE37,512 | E | 1/2002 | Szlufcik et al. |
| 6,338,809 | B1 | 1/2002 | Hampden-Smith et al. |
| 6,379,745 | B1 | 4/2002 | Kydd et al. |
| 6,413,790 | B1 | 7/2002 | Duthaler et al. |
| 6,498,714 | B1 | 12/2002 | Fujisawa et al. |
| 6,506,438 | B2 | 1/2003 | Duthaler et al. |
| 6,582,763 | B1 | 6/2003 | Nishmura et al. |
| 6,697,694 | B2 | 2/2004 | Mogensen |
| 6,808,867 | B2 | 10/2004 | Doshi et al. |
| 6,811,885 | B1 | 11/2004 | Andriessen et al. |
| 6,814,795 | B2 | 11/2004 | McVicker et al. |
| 6,866,929 | B2 | 3/2005 | Kodas et al. |
| 6,951,666 | B2 | 10/2005 | Kodas et al. |
| 6,958,095 | B2 | 10/2005 | Kakimoto et al. |
| 7,115,218 | B2 | 10/2006 | Kydd et al. |
| 7,332,264 | B2 | 2/2008 | Doshi et al. |
| 7,524,528 | B2 | 4/2009 | Kodas et al. |
| 7,533,361 | B2 | 5/2009 | Edwards |
| 7,553,512 | B2 | 6/2009 | Kodas et al. |
| 7,585,349 | B2 | 9/2009 | Xia et al. |
| 7,597,769 | B2 | 10/2009 | Hampden-Smith et al. |
| 7,625,420 | B1 | 12/2009 | Kodas et al. |
| 7,629,017 | B2 | 12/2009 | Kodas et al. |
| 7,732,002 | B2 | 6/2010 | Kodas et al. |
| 7,749,299 | B2 | 7/2010 | Vanheusden et al. |
| 2001/0006936 | A1 | 7/2001 | Lee et al. |
| 2002/0014182 | A1 | 2/2002 | Yadav et al. |
| 2002/0067394 | A1 | 6/2002 | Yoshihiro et al. |
| 2002/0146564 | A1 | 10/2002 | Takai et al. |
| 2003/0003231 | A1 | 1/2003 | Kiguchi et al. |
| 2003/0009726 | A1 | 1/2003 | Chang et al. |
| 2003/0108664 | A1 | 6/2003 | Kodas et al. |
| 2003/0129542 | A1 | 7/2003 | Shih et al. |
| 2003/0148024 | A1 | 8/2003 | Kodas et al. |
| 2003/0178057 | A1 | 9/2003 | Fujii et al. |
| 2003/0215565 | A1 | 11/2003 | Chang et al. |
| 2004/0075196 | A1 | 4/2004 | Leyden et al. |
| 2004/0242019 | A1 | 12/2004 | Klein et al. |
| 2005/0133823 | A1 | 6/2005 | Mori et al. |
| 2005/0151820 | A1 | 7/2005 | Sirringhaus et al. |
| 2006/0159838 | A1 | 7/2006 | Kowalski et al. |
| 2006/0160373 | A1 | 7/2006 | Kowalski et al. |
| 2006/0162497 | A1 | 7/2006 | Kodas et al. |
| 2006/0163197 | A1 | 7/2006 | Arakawa et al. |
| 2006/0189113 | A1 | 8/2006 | Vanheusden et al. |
| 2006/0231804 | A1 | 10/2006 | Wang et al. |
| 2007/0056402 | A1 | 3/2007 | Cho et al. |
| 2007/0117271 | A1 | 5/2007 | Kodas et al. |
| 2007/0120098 | A1 | 5/2007 | Kodas et al. |
| 2007/0120099 | A1 | 5/2007 | Kodas et al. |
| 2007/0125989 | A1 | 6/2007 | Kodas et al. |
| 2008/0008822 | A1 | 1/2008 | Kowalski et al. |
| 2008/0034921 | A1 | 2/2008 | Vanheusden et al. |
| 2008/0093422 | A1 | 4/2008 | Kodas et al. |
| 2008/0145633 | A1 | 6/2008 | Kodas et al. |
| 2009/0053400 | A1 | 2/2009 | la Vega et al. |
| 2010/0151267 | A1 | 6/2010 | Kodas et al. |
| 2010/0230841 | A1 | 9/2010 | Hampden-Smith et al. |

FOREIGN PATENT DOCUMENTS

| | | |
|---|---|---|
| EP | 1244168 | 9/2002 |
| EP | 1801890 | 3/2010 |
| JP | 2004235272 | 8/2004 |
| WO | 9919900 | 4/1999 |
| WO | 02087749 | 11/2002 |
| WO | 03016961 | 2/2003 |
| WO | 2005050673 | 6/2005 |
| WO | 2006078825 | 7/2006 |
| WO | 2007053408 | 5/2007 |
| WO | 2007149883 | 12/2007 |

OTHER PUBLICATIONS

Palchik et al., Preparation and Characterization of Ni/NiO Composite using Microwave Irradiation and Sonication, NanoStructured Materials, vol. 11, No. 3, pp. 415-420, 1999.

Kwon, Viscosity of magnetic particle suspension, Journal of Molecular Liquids 75 (1998) 115-126.

Silvert et al., Preparation of colloidal silver dispersions by the polyol process, Part 2—Mechanism of particle formation, J. Mater Chem., 1997, 7(2), pp. 293-299.

Transmittal; International Search Report; and Written Opinion of the International Searching Authority for International Application No. PCT/US2008/013458.

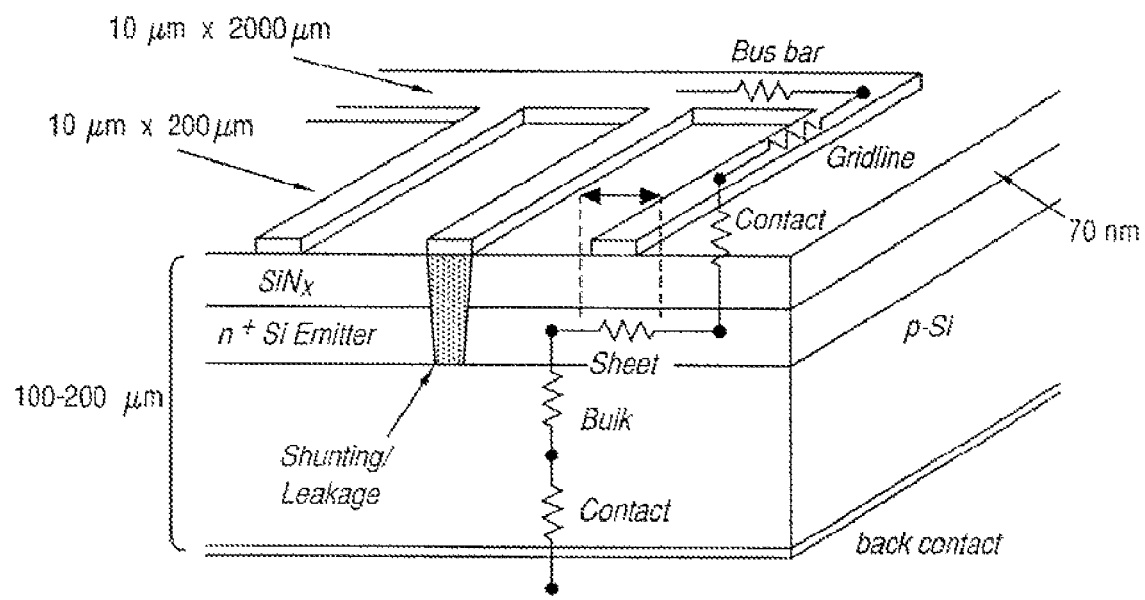

FORMING PHOTOVOLTAIC CONDUCTIVE FEATURES FROM MULTIPLE INKS

RELATED APPLICATIONS

This application is a divisional of U.S. patent application Ser. No. 11/952,580, filed Dec. 7, 2007, which is hereby incorporated by reference in its entirety.

BACKGROUND OF THE INVENTION

1. Field of the Invention

This invention relates to processes for forming photovoltaic conductive features. More specifically, the invention relates to processes for forming photovoltaic conductive features from multiple inks, where at least one of the inks is capable of etching a passivation layer on a substrate. Such processes are useful in the production of photovoltaic cells.

2. Discussion of the Background Information

Improvement in solar cell efficiency can have a significant impact in the broad market adoption of solar cell technology. It is possible, for example, that a 0.2% cell efficiency improvement derived from improved performance of front grid electrodes for solar cells could lead to as much as $250M cost savings for the solar cell manufacturing market in 2010.

Major factors that inhibit solar cell efficiency include contact resistance and line resistance in the front grid electrodes. A portion of a typical solar cell is depicted schematically in FIG. 1. Under known screen printing methods for forming front grid electrodes, high contact resistance arises as a result of the processing conditions of the solar cell after a screen printing paste is applied to the passivation layer of a solar cell. The passivation layer often comprises silicon nitride. Typical screen printing pastes comprise more than 5 wt % micron-sized lead glass particles and on the order of 75 wt % micron-sized silver particles. The glass particles etch the silicon nitride passivation layer at the emitter/electrode interface at high processing temperatures (e.g., >800° C.). Etching of the silicon nitride passivation layer is necessary to achieve a satisfactory contact between the electrode and the emitter surface (e.g., the surface of an n-type semiconductor). At such high temperatures, however, the diffusion rate of silver in the silicon emitter layer of the solar cell is high and complete etching of the n-type semiconductor layer undesirably can result causing shunting in the cell, as shown in FIG. 1.

In addition, when screen printing is used to form the front grid electrodes, undesirably high line resistance may arise as a result of the amount of glass present in the bulk electrode layer. Because the glass particles are relatively large (in the micron size range), the glass particles have relatively low reactivity and do not sinter to form a dense body under the processing conditions described above. The presence of unsintered glass particles in the bulk electrode layer leads to high porosity in that layer. Porosity in the bulk electrode layer may, in turn, lead to high line resistance in the bulk electrode layer.

While screen printing is an inexpensive and fast method for printing front grid electrodes, it also does not allow for the printing of narrow gridlines. In addition, the contact pressure associated with conventional screen printing methods can lead to solar cell breakage due to the fact that the cell must be mechanically handled. There is therefore a need for methods for printing front grid electrodes that afford narrow gridlines while minimizing cell breakage. Further, there is a need for methods for printing front grid electrodes that minimize the contact and line resistances.

SUMMARY OF THE INVENTION

It has been surprisingly found that an efficient way to meet the aforementioned needs is to form photovoltaic cell conductive features from multiple inks, at least one of which is capable of etching the passivation layer.

The present invention provides processes for forming photovoltaic conductive features. In one aspect, the invention provides a process for forming a photovoltaic conductive feature comprising (a) providing a substrate comprising a passivation layer disposed on a silicon layer; (b) depositing a surface modifying material comprising a salt onto at least a portion of the passivation layer; (c) depositing a composition comprising at least one of metallic nanoparticles comprising a metal or a metal precursor to the metal onto at least a portion of the substrate; and (d) heating the composition such that it forms at least a portion of a photovoltaic conductive feature in electrical contact with the silicon layer, wherein at least one of the composition or the surface modifying material etches a region of the passivation layer.

In another aspect, the invention relates to a process for forming a photovoltaic conductive feature, comprising: (a) providing a substrate comprising a passivation layer disposed on a silicon layer; (b) depositing a surface modifying material comprising a UV-curable material; (c) curing the UV-curable material to form a cured material; (d) depositing a composition comprising at least one of metallic nanoparticles comprising a metal or a metal precursor to the metal onto at least a portion of the cured material; and (e) heating the cured material and the composition such that at least one of the cured material or the composition etches a region of the passivation layer and such that the composition forms at least a portion of a photovoltaic conductive feature that is in electrical contact with the silicon layer.

BRIEF DESCRIPTION OF THE DRAWINGS

The present invention will be better understood in view of the non-limiting FIGURE, which illustrates the structure of a photovoltaic cell.

DETAILED DESCRIPTION OF THE INVENTION

Introduction

The present invention relates to processes for forming photovoltaic conductive features in which a receiving layer comprising a salt or a UV curable material is initially deposited on a substrate surface followed by deposition of a composition, e.g., ink, onto the receiving layer and treating the deposited composition under conditions effective to form the photovoltaic conductive features. In various preferred embodiments, the substrate comprises a passivating layer, which is etched by either or both the receiving layer material or a material from the composition, e.g., ink, that is used to form the conductive feature. The receiving layers desirably also facilitate confining the composition to a desired region in forming the photovoltaic conductive features and hence inhibit spreading of the composition.

In one embodiment, the invention relates to a process for forming a photovoltaic conductive feature, comprising: (a) providing a substrate comprising a passivation layer disposed on a silicon layer; (b) depositing a surface modifying material comprising a salt onto at least a portion of the passivation layer; (c) depositing a composition comprising at least one of metallic nanoparticles comprising a metal or a metal precursor to the metal onto at least a portion of the substrate; and (d) heating the composition such that it forms at least a portion of a photovoltaic conductive feature in electrical contact with the silicon layer, wherein at least one of the composition or the surface modifying material etches a region of the passivation layer.

In a second embodiment, the invention relates to process for forming a photovoltaic conductive feature, comprising: (a) providing a substrate comprising a passivation layer disposed on a silicon layer; (b) depositing a surface modifying material comprising a UV-curable material; (c) curing the UV-curable material to form a cured material; (d) depositing a composition comprising at least one of metallic nanoparticles comprising a metal or a metal precursor to the metal onto at least a portion of the cured material; and (e) heating the cured material and the composition such that at least one of the cured material or the composition etches a region of the passivation layer and such that the composition forms at least a portion of a photovoltaic conductive feature that is in electrical contact with the silicon layer.

The Composition

As indicated above, the invention relates to processes for forming photovoltaic conductive features in which a composition, e.g., an ink composition, comprising at least one of metallic nanoparticles comprising a metal or a metal precursor to the metal is used to form at least a portion of a photovoltaic conductive feature that is in electrical contact with a silicon layer. The specific components contained in the composition may vary widely in the various aspects of the invention so long as the composition includes at least one of metallic nanoparticles comprising a metal or a metal precursor to the metal and so long as the composition is capable of forming a conductive feature upon heating.

Metallic Nanoparticles

As indicated above, in some aspects the compositions employed in the processes of the present invention comprise metallic nanoparticles that are used to produce the photovoltaic conductive features. If included in the composition, the metallic nanoparticles preferably comprise a metal or a metal alloy. The particles may be present as individual metallic nanoparticles and/or the particles may be present as aggregates of multiple metallic nanoparticles. The nature of the metallic nanoparticles, as aggregates and/or as individual particles, will depend upon the relative amounts of metal contained in the composition as well as the processes employed in forming the metallic nanoparticles.

The metal in the particles may include virtually any type of metal and can include either single metals or metal alloys. Particularly preferred metals include palladium (Pd), silver (Ag), nickel (Ni), cobalt (Co), copper (Cu), gold (Au), platinum (Pt), molybdenum (Mo), tungsten (W), zinc (Zn), ruthenium (Ru), titanium (Ti), and the like. Exemplary alloys include a Ag/Pd alloy, such as one having a Ag:Pd ratio of about 70:30, as well as Cu/Ni, Cu/Zn, and Pd/Pt alloys. Preferred are metallic nanoparticles comprising at least one of palladium, silver, nickel, copper, gold and platinum, and even more particularly those including at least one of palladium, silver, nickel and copper. Most preferably, the metal is silver or a silver alloy.

In some embodiments, the metallic nanoparticles comprise a continuous or non-continuous cap or coating thereon. The cap or coating optionally comprises an organic cap or coating that can comprise a polymer. The cap or coating optionally comprises an intrinsically conductive polymer, a sulfonated perfluorohydrocarbon polymer, polystyrene, polystyrene/methacrylate, sodium bis(2-ethylhexyl) sulfosuccinate, tetra-n-octyl-ammonium bromide or an alkane thiolate. In other embodiments, the cap or coating comprises an agglomeration inhibiting polymer such as, but not limited to, polyvinylpyrrolidone (PVP). In still other embodiments, the cap or coating comprises a ceramic material. When the cap or coating comprise a ceramic material, the particles optionally have a core/shell configuration, in which the core is composed of a metal or metal alloy and the shell is composed of a ceramic material. The ceramic material is optionally present in the form of a continuous or non-continuous coating. The ceramic material, when present, preferably allows the metallic nanoparticles to etch a layer of the substrate onto which they are deposited, e.g., the passivation layer, e.g., $SiN_X$ layer, of an n and p-doped silicon wafer, as shown in FIG. 1. When the nanoparticles comprise aggregates, the aggregates optionally comprise multiple metallic nanoparticles within a common matrix of the ceramic material.

When the particles comprise a ceramic material, the choice of ceramic material is not narrowly limited, although in the usual case, where the ceramic material condenses at a higher temperature than the metal in the vapor phase synthesis process, the relative surface wetting properties of the metal and the ceramic should be such as to allow redistribution of the metal, as it condenses on the ceramic, to form a surface layer to the core of the final particle. Typically the ceramic shell material includes an oxide, such as an oxide of at least one of silicon, zinc, zirconium, aluminum, titanium, ruthenium, tin, cerium, lead, strontium, sodium, calcium, bismuth, boron, lithium, and phosphorous. In some embodiments, the ceramic material comprises a mixture of a plurality of metal oxides. In other embodiments, the ceramic shell material comprises an oxide of at least one element selected from lead, strontium, sodium, calcium, bismuth, and boron. Some preferred oxides are silica, titania, zirconia, ceria, and tin oxide, with silica being particularly preferred. In a preferred embodiment, the ceramic material comprises glass.

The oxides mentioned above can be doped with low or high amounts of dopant elements, where high doping concentration can result in formation of distinct mixed metal oxide phases. In some cases, the oxide or oxides used as the ceramic material can produce a glass-like shell on the particles. The oxide can be a complex oxide consisting of two or more elements, e.g. Y—Yb—O, Ba—Ti—O, Zn—Si—B—O and others. Furthermore, a variety of other ceramic materials may be used to produce the particle shell, such as carbides, for example silicon or titanium carbides; borides, for example titanium boride; and nitrides, including silicon or titanium nitrides; silicides, for example titanium silicide; oxynitrides; oxysulfides; and oxycarbides.

When the particles comprise a ceramic material, whether the particles are individual metallic nanoparticles and/or aggregates of multiple metallic nanoparticles, the volume ratio of metal to ceramic material in each particle is normally at least 9:1 (90 vol % metal/10 vol % ceramic), such as at least 19:1 (95 vol % metal/5 vol % ceramic), and at least 98:1 (98 vol % metal/1 vol % ceramic). As a result, the thickness of the ceramic coating is generally very thin (typically less than 10 nanometers) so that, in the case of the preferred embodiment of glass-coated silver particles, at high silver concentration (>95% wt), the particles are conductive.

When the particles comprise a ceramic material, depending on the specific materials chosen for the metal and the ceramic material, the final particles may exhibit enhanced or additional functionality as compared with nanoparticles of the uncoated metal. For example, the oxide layer can be a partially transparent color layer, in which case the final metal/metal oxide particle may exhibit metallic reflectivity combined with color. In addition, if $SiO_2$ is employed as the shell material, various known methods for treating silica surfaces (such as silanation, imparting of hydrophobic or hydrophilic properties, addition of different ligands to the silica surface, modification of surface acidity, and others) can be employed to provide the particles with functionalities such as enhanced adhesion, improved wear and environmental resistance, and reduced curing time. In some embodiments particles are functionalized with one or more functional groups. The functional groups optionally comprise a silane, e.g., a silane comprising hexamethyl disilazane. In other embodiments, the functional groups comprise a siloxane, e.g., an ethylene oxide functional siloxane such as Gelest 2-methoxy(polyethyleneoxy) propyltrimethoxysilane.

The particles (as individual particles or as part of an aggregate) of some embodiments of the present invention are crystalline metallic nanoparticles and have small crystal domains having a size of less than 50 nm as measured by X-ray diffraction (XRD) and having a primary particle size as measured by transmission electron microscopy (TEM) of from about 10 nanometers to less than 100 nanometers, typically from about 10 nanometers to about 80 nanometers, such as from about 10 nanometers to about 50 nanometers, or from about 20 nanometers to about 60 nanometers, for example from about 30 nanometers to about 50 nanometers. The particle size, as used herein, means the volume average particle size.

In some embodiments the particles have a primary particle size of from about 10 nanometers to about 500 nanometers, such as from about 10 nanometers to about 300 nm, from about 10 nanometers to about 200 nm, and from about 10 nanometers to about 100 nm.

In addition, in some embodiments, whether present as aggregates or individual particles, the metal or metal alloy domains of the particles tend to exhibit a narrow particle size distribution such that at least 80 weight percent, preferably at least 90 weight percent of the particles, have a size of less than 500 nanometers, wherein the particle size distribution is measured using quasi-electric light scattering (QELS). In some embodiments, the metallic nanoparticles have a particle size distribution such that at least 90 weight percent of the particles have a size of less than 2 µm, e.g., less than 1 µm. Additionally, in an optional embodiment, the metallic nanoparticles include a small amount of micron-sized particles. For example, the particles optionally have a particle size distribution such that at least 1 weight percent, e.g., at least 5 weight percent or at least 10 weight percent of the particles have a size of greater than 1 µm.

In some embodiments, when the metallic nanoparticles are present as aggregates, the aggregates generally have a weight average particle size of less than 500 nanometers, such as less than 300 nanometers, for example less than 200 nanometers, in some cases less than 100 nanometers, and less than 50 nanometers, wherein the aggregate size is measured using QELS. In some embodiments, the aggregates have a particle size of from 75 nanometers to 500 nanometers, e.g., from 75 nanometers to 300 nanometers, from 75 nanometers to about 200 nanometers, or from 100 nanometers to 500 nanometers. Typically, each the aggregates comprises an average of less than 20, for example an average of less than 10, such as an average of less than 5, of said metallic nanoparticles per aggregate. Because of their small size, the aggregates may be ink-jettable without comminution.

Processes for forming metallic particles, e.g., metallic nanoparticles are known. Vapor phase synthetic methods for the formation of metallic nanoparticles are disclosed, for example, in Published U.S. Patent Application No. 2006/0165898, the entirety of which is incorporated by reference. Briefly, however, the metallic nanoparticles employed in the processes of the present invention may be produced by a single step process in which precursors to the metal, such as those described above, are vaporized in a high temperature reaction zone of a flame spray pyrolysis apparatus to form a vapor of the metal precursor to the metal. The vapors are then allowed to condense/nucleate to form the desired metallic nanoparticles. In some embodiments, the metal precursor to the metal is vaporized in the presence of a ceramic material precursor. Non-limiting examples of ceramic material precursors include hexamethyldisiloxane (HMDS), 2-ethylhexanoate and nitrate salts of zinc, zirconium, bismuth, and strontium. Once the metallic nanoparticles are formed, they are ultimately collected, for example, using filters, such as a bag house or an electrostatic precipitator.

Metal Precursor to the Metal

In some embodiments, the compositions used to produce the photovoltaic conductive features of the present invention comprise a metal precursor to the metal instead of, or in addition to the metallic particles, e.g., metallic nanoparticles, discussed above. It will be appreciated that these same metal precursors to the metal can be used to produce the metallic nanoparticles using the vapor phase synthetic processes discussed in greater detail below. The metal precursors to the metal include metal precursors to silver, nickel, platinum, gold, palladium, copper, indium and tin. Other metal precursors can include precursors to aluminum, zinc, iron, tungsten, molybdenum, ruthenium, lead, bismuth and similar metals. Preferred metal precursor compounds are metal precursor compounds containing silver, nickel, platinum, gold, palladium, copper and ruthenium. Examples of metal precursors to, e.g., silver, nickel, platinum, gold, palladium and copper are disclosed in U.S. Published Patent Application No. 2007/0125989, the entirety of which is incorporated by reference as if fully set forth herein.

In some embodiments according to the present invention, the metal precursor to the metal comprises anions that have the ability to etch a surface of the substrate on which it is deposited. For example, in a preferred embodiment, the substrate comprises a passivation layer, e.g., a silicon nitride layer, disposed thereon, and the metal precursor is capable of etching through the passivation layer to the underlying material, e.g., a p-silicon wafer. Anions that may have the ability to etch the passivation layer of such wafers include, but are not limited to $CF_3CO_2^-$; $CF_3SO_3^-$; $FSO_3^-$; $CF_3COCHCOCF_3^-$; $PO_4^{3-}$; $PO_3OH^{2-}$; $PO_2(OH)_2^-$, including perfluorinated phosphate esters and salts. For example materials such as Zonyl™ provided by Dupont and Fluorads™ provided by 3M. Preferred metal precursors to the metal that comprise these anions include metallic cations of silver, copper, gold, palladium, platinum, nickel, cobalt, zinc, molybdenum, tungsten, ruthenium, and titanium.

Preparation of Compositions

The compositions used to form the photovoltaic conductive features of certain embodiments of the present invention can either be inks or pastes, depending on the method used for depositing the compositions on a substrate. The compositions preferably comprise the above-described metallic nanoparticles and/or a metal precursor to a metal. In some embodiments, the composition is optionally substantially free of metallic nanoparticles, and comprises a metal precursor to a metal. Conversely, in some embodiments, the composition is substantially free of a metal precursor to a metal and comprises metallic nanoparticles. In a preferred embodiment, the compositions of the invention comprise a vehicle capable of stably maintaining the composition in a fluid state. In optional embodiments, the compositions of the invention comprise, in addition to the vehicle, metallic nanoparticles and/or metal precursor to a metal, as described above, and optionally dispersants and one or more of the additives discussed in greater detail below.

Depending on the formulation, the compositions of the invention may be useful in a number of different printing methods, including, for example, screen printing, lithographic printing, gravure printing, flexographic printing, photopatterning printing, syringe printing, aerosol jetting, piezoelectric printing, thermal printing, drop-on-demand printing or ink-jet printing, preferably screen printing, ink-jet printing, or direct-write printing.

Although highly dependant on material and the specific printing process being implemented, in various embodiments where the composition comprises metallic nanoparticles, the metallic nanoparticle loading in the compositions optionally is at least about 5% by weight, e.g., at least about 10% by weight, at least about 20% by weight, at least about 30% by weight, at least about 50% by weight, or at least about 70% by weight, based on the total weight of the total composition. It is preferred for the total loading of the metallic nanoparticles useful in the compositions used to form the photovoltaic conductive features of the present invention to be not higher than about 85% by weight, e.g., not higher than about 75% by weight, not higher than about 40% by weight, not higher than about 20% by weight, not higher than about 10% by weight, or not higher than about 5% by weight, based on the total weight of the composition. In various embodiments where the composition comprises metallic nanoparticles, in terms of ranges, the composition optionally comprises from about 1 wt % to about 60 wt. % metallic nanoparticles, e.g., from about 2 to about 40 wt. % metallic nanoparticles, from about 5 to about 25 wt. % metallic nanoparticles, or from about 10 to about 20 wt. % metallic nanoparticles, based on the total weight of the composition. In various other embodiments, the composition comprises from about 40 wt % to about 75 wt. % metallic nanoparticles, e.g., from about 40 to about 60 wt. % metallic nanoparticles, based on the total weight of the composition. Loadings in excess of the preferred loadings can lead to undesirably high viscosities and/or undesirable flow characteristics. Of course, the maximum loading that still affords useful results also depends on the density of the metallic nanoparticles. In other words, for example, the higher the density of the metal of the metallic nanoparticles, the higher will be the acceptable and desirable loading in weight percent.

Although highly dependant on material and the specific printing process being implemented, in various embodiments the composition comprises a metal precursor to the metal in addition to, or in place of metallic nanoparticles. The metal precursor to the metal is preferably highly soluble in the selected vehicle. In those embodiments in which the composition comprises a metal precursor, the composition preferably includes at least about 5 weight percent of the metal precursor to the metal, e.g., at least about 20 weight percent of metal precursor to the metal, such as from about 30 weight percent to about 60 weight percent. It is particularly preferred that the metal precursor to the metal be added to the composition up to the solubility limit of the precursor compound in the vehicle. The metal precursor to the metal preferably provides as high a yield of metal as possible.

As mentioned above, the compositions of the present invention preferably comprise a vehicle in addition to the metallic nanoparticles and/or the metal precursor to the metal. The vehicle for use in the compositions is preferably a liquid that is capable of stably dispersing the metallic nanoparticles and/or dissolving the metal precursor to the metal. For example, vehicles are preferred that are capable of affording a composition that can be kept at room temperature for several days or even one, two, three weeks or months or even longer without substantial agglomeration and/or settling of the metallic nanoparticles, if present, and/or precipitation of the metal precursor to the metal. To this end, it is also preferred for the vehicle to be compatible with the surface of the metallic nanoparticles and/or the solubility profile of the metal precursor to the metal. In one embodiment, the vehicle comprises (or predominantly consists of) one or more polar components (solvents) such as, e.g., a protic solvent, or one or more aprotic, non-polar components, or a mixture thereof. The vehicle, in an embodiment, is a solvent selected from the group consisting of alcohols, polyols, amines, amides, esters, acids, ketones, ethers, water, saturated hydrocarbons, unsaturated hydrocarbons, and mixtures thereof.

In some embodiments, the vehicle comprises a mixture of at least two solvents, optionally at least two organic solvents, e.g., a mixture of at least three organic solvents, or at least four organic solvents. The use of more than one solvent is preferred because it allows, inter alia, to adjust various properties of a composition simultaneously (e.g., viscosity, surface tension, contact angle with intended substrate etc.) and to bring all of these properties as close to the optimum values as possible. Non-limiting examples of vehicles are disclosed in, e.g., U.S. Pat. Nos. 4,877,451; 5,679,724; 5,725,647; 5,837,041; 5,837,045 and 5,853,470, the entire disclosures of which are incorporated by reference herein. In another embodiment, the vehicle comprises water, optionally primarily water.

The compositions optionally further comprise one or more additives, such as, but not limited to, buffers, polymers, resins (e.g., 20 wt % of an ethyl cellulose solution in terpineol), dispersants, thickeners, adhesion promoters, rheology modifiers, surfactants (ionic, non-ionic, anionic, cationic, zwitterionic surfactants including ions comprising a sulfate ion, sulfonate ion, carboxylate ion, phosphate ion, ammonium ion or a phosphonium ion; a non-limiting example of a surfactant is sodium dilaureth phosphonate 10 (DLP-10)), wetting angle modifiers, humectants (e.g., glycerol, ethylene glycol, 2-pyrrolidone, and 1,5-pentanediol), crystallization inhibitors (e.g., 29,000 MW PVP), binders, dyes/pigments and the like. Non-limiting examples of adhesion promoters include shellac, latex, acrylates, other polymers, metal or a main group oxide (e.g., $SiO_2$, CuO). Additional examples of adhesion promoters are described in U.S. Pat. No. 5,750,194, which is herein fully incorporated by reference. Furthermore, polymers such as, but not limited to, e.g., polyamic acid polymers, acrylic polymers, PVP, co-polymers of PVP (alkanes, styrenes, etc.), polyfluorosilicate polymers, polyflourinated telomers (including ZONYL™ products, e.g., TELOMER B, manufactured by E.I. DuPont de Nemours & Co.), and co-polymers of styrene acrylics (e.g., those sold under the JONCRYL™ trade name available from Johnson Polymer Corp.) can improve the adhesion of the metallic particles and/or metallic nanoparticles to a polymer substrate, as can substances such as coupling agents (e.g., zinc oxides, titanates and silanes). These substances can function to increase adhesion of the feature to the substrate, as well as to decrease the interaction of water with the feature thereby rendering the feature more durable. Cohesion promoters may also be included in the ink to improve reflective feature durability.

Non-limiting examples of rheology modifiers include SOLTHIX 250 (Lubrizol), SOLSPERSE 21000 (Lubrizol), styrene allyl alcohol (SAA), ethyl cellulose, carboxy methylcellulose, nitrocellulose, polyalkylene carbonates, ethyl nitrocellulose, and the like.

Non-limiting examples of dispersants for use in polar and nonpolar liquid media include: polymers, ionic dispersants, non-ionic dispersants, co-polymers, block co-polymers, acrylics, styrene acrylics, styrenic dispersants, polyesters, copolymers of polyethers and polycarbonates, ammonium salt of polyacrylic acid; ammonium salt of a styrene acrylic polymers; polymeric carboxylic acid; sodium salt of a polymeric carboxylic acid; anionic macromolecular surfactant, condensed naphthalene sulfonic acid; methyl hydroxyethyl cellulose; anionic and nonionic surfactants; polycarboxylic acid surfactant; polyoxyethylenesorbitan fatty acid ester; polyoxyethylene sorbitan monooleate; polyoxyethylene sorbitan monostearate; salts of polyfunctional oligomer; sodium dodecyl benzene sulfonate; sodium or ammonium salt of a sulfate ester an alkylphenoxypoly(ethyleneoxy)ethanol; sodium salt of a carboxylated polyelectrolyte; sodium salt of condensed naphthalene sulfonate; sodium salt of disulohonic acids; sodium salt of polyacrylic acids polyacrylic acids; sodium salt of polymerized alkyl naphthalene sulfonic acid; sodium salt of polymerized alkyl-aryl sulfonic acid; sodium salts of polymerized substituted alkyl-aryl sulfonic acids; sodium salts of polymerized substituted benzoid alkyl sulfonic acids; sodium tetraborate; ammonium salt of carboxylated polyelectrolyte alkylphenol ethoxylates; condensation product of naphthalene sulfonic acid formaldehyde; condensation product sulfo-succinic acid ester of an alkoxylated novolak; nonylphenol novolak ethoxylate; condensation product of cresol-formaldehyde-schaffer salt; sodium salt of a cresol-formaldehyde condensation product; fatty acid methyl tauride sodium salt; phosphate of EO—PO-EO blockpolymer such those provided by Lyondell Corporation call Ethacryl™; 2,4,6-Tri-(1-phenylethyl)-phenol polyglycol ether phosphoric acid ester; 2,4,6-Tri-1 (1-phenylethyl)-phenol polyglycol ether monophosphate triethanolamine salt; tri-sec,-butylphenol polyglycol ether phosphoric acid ester with 4 EO; alkyl polyglycol ether phosphoric acid ester with 6 EO; alkyl polyglycol ether phosphoric acid ester with 8 EO; 2,4,6-Tri-(1-phenylethyl)-phenol polyglycol ether sulfate ammonium salt; sulfosuccinic ester of ethoxylated castor oil; mannitol; sodium lauryl sulfate; and mono & disaccharides. EO—PO— acrylic polymers, sodium or ammonium salts. In some embodiments, the dispersant is selected from the group consisting of an ammonium salt of polyacrylic acid; an ammonium salt of styrene acrylic polymer; a sodium salt of condensed naphthalene sulfonate; a sodium salt of polymerized alkyl naphthalene sulfonic acid; a phosphate of an EO—PO-EO block polymer; a sodium salt of an EO—PO— acrylic polymer; and an ammonium salt of an EO—PO— acrylic polymer. In a preferred embodiment, the dispersant comprises polyvinyl pyrrolidone (PVP).

The compositions optionally further comprise ceramic particles. In some embodiments, ceramic particles incorporated into the compositions of the present invention etch a layer of the substrate onto which they are deposited, e.g., the passivation layer of a p-silicon wafer. The ceramic particles include an oxide, such as an oxide of at least one of silicon, zinc, zirconium, aluminum, titanium, ruthenium, tin, cerium, lead, strontium, sodium, calcium, bismuth, boron, lithium, and phosphorous. In some embodiments, the ceramic particles comprise a mixture of a plurality of metal oxides. The ceramic particles are optionally ceramic nanoparticles. The ceramic particles, in some embodiments, have a primary particle size of from about 10 nanometers to less than 100 nanometers, typically from about 10 nanometers to about 80 nanometers, such as from about 10 nanometers to about 50 nanometers, or from about 20 nanometers to about 60 nanometers, for example from about 30 nanometers to about 50 nanometers. The particle size, as used herein, means the weight average particle size. In other embodiments, the ceramic particles have a particle size distribution such that at least 90 weight percent of the particles have a size of less than 2 µm, e.g., less than 1 µm. Additionally, in an optional embodiment, the ceramic particles include a small amount of micron-sized particles. For example, the particles optionally have a particle size distribution such that at least 1 weight percent, e.g., at least 5 weight percent or at least 10 weight percent of the particles have a size of greater than 1 µm.

In some specific embodiments, the composition comprises 1-90 wt % metallic nanoparticles (e.g., 10-90 wt %, 40-90 wt %, 70-90 wt %, 1-20 wt %, 1-10 wt %, 5-20 wt %, and 5-15 wt %), 0.1-5 wt % polyvinyl pyrrolidone (e.g., 0.1-1 wt %, 1-5 wt %, and 2-5 wt %; average MW=29,000), 40-80 wt % water (e.g., 40-50 wt %, 40-60 wt %, and 50-80%), 0 to 50 wt % glycerol (e.g., 0-20 wt %, 10-40 wt %, and 20-50 wt %), and 0.01-1.5 wt % DLP-10 (e.g., 0.01-1 wt %, 0.5-1.5 wt %, and 0.9-1.5 wt %). In an optional embodiment, the compositions can be formulated by using, in combination, water (e.g., 40-80 wt %), glycerol (e.g., 0-60 wt %), surfactant (e.g., 0-10 wt %; e.g., DLP-10), and buffer (e.g., 0-2 wt %; e.g., ammonium hydroxide). The compositions can also optionally be formulated by using, in combination, water (e.g., 84 wt %), 2-pyrrolidinone (e.g., 2 wt %), urea (e.g., 0.2 wt %), glycerin (e.g., 2.1 wt %), diethylene glycol (e.g., 7.5 wt %) and SURFYNOL® 104E (e.g., 0.2 wt %). The compositions can also optionally be formulated by using, in combination, water (e.g., 85 wt %), 2-pyrrolidinone (e.g., 2 wt %), glycerin (e.g., 2 wt %), diethylene glycol (e.g., 2 wt %), and isopropyl alcohol (e.g., 5 wt %).

Additionally, the compositions can optionally be formulated according to the methods described in U.S. Pat. Nos. 5,662,286; 5,624,485; 4,567,213; 4,390,369; 5,662,736; 5,596,027; 5,786,410; 5,643,356; 5,642,141, the entireties of which are incorporated herein by reference. Also, the compositions can optionally be formulated according to the methods described in published PCT Application No. WO94/03546, the entirety of which is incorporated herein by reference. Finally, the compositions can optionally be formulated according to the methods described in European Patent Application Nos. EP0745479; EP0805192; EP0745651; and EP0952195, the entireties of which are incorporated herein by reference.

Once formulated, in some embodiments according to the present invention, the composition has a viscosity of greater than about 5,000 cP, e.g., greater than 7,000 cP and greater than 10,000 cP. Compositions with the aforementioned viscosities are particularly useful in the optional screen-printing embodiments of the present invention. In other embodiments, the composition has a viscosity of less than about 100 cP, e.g., less than about 50 cP, less than about 10 cP, less than about 5 cP and less than about 1 cP. In still other embodiments, the composition has a viscosity of from about 50 cP to about 300 cP, e.g., from about 50 cP to about 200 cP and from about 50 to about 100 cP. In some embodiments according to the first aspect of the present invention, the composition has a surface tension of from about 20 dynes/cm to about 60 dynes/cm, e.g., from about 20 dynes/cm to about 40 dynes/cm.

Substrate

The composition according to the present invention can be deposited and converted to a photovoltaic conductive feature at low temperatures, thereby enabling the use of a variety of substrates having a relatively low melting or decomposition temperature. The types of substrates that are particularly useful according to the present invention include polyfluorinated compounds, polyimides, epoxies (including glass-filled epoxy), polycarbonates and many other polymers. In some embodiments, substrates can also include cellulose-based materials such as wood or paper, acetate, polyester, polyethylene, polypropylene, polyvinyl chloride, acrylonitrile, butadiene (ABS), flexible fiber board, non-woven polymeric fabric, cloth, metallic foil and thin glass.

Preferred substrates include substrates comprising a passivation layer, e.g., silicon nitride layer, disposed on a silicon layer. The entire substrate preferably has a surface roughness greater than that of the underlying silicon layer such that incident light is not reflected off of the substrate but rather is readily absorbed by the substrate so as to maximize efficiency of the photovoltaic feature. The passivation layer preferably is thin so as to minimize the degree of etching that is necessary according to the present invention. In some exemplary embodiments, the passivation layer is has an average thickness less than 80 nm, e.g., less than 70 nm, or less than 60 nm.

In a preferred embodiment, the substrate comprises a passivation layer disposed on a p-silicon wafer. As indicated in FIG. 1, conventional photovoltaic cells include a first layer comprising an n-doped silicon wafer, and a second layer comprising a p-doped silicon wafer. Accordingly, the substrate optionally comprises both an n-doped silicon wafer and a p-doped silicon wafer disposed thereon.

In another aspect, the substrate comprises a flexible substrate, and in particular flexible substrates that are suitable for forming flexible thin film solar cells. A non-limiting list of examples of flexible substrates includes flexible polymers, polyesters provide under trade names Mylar™, Melinex™, and Teijin™, thin metals such as stainless steel, aluminum, and higher temperature films such as Kapton™. In this aspect, the substrate typically will not comprise a passivation layer. As a result, the primary purpose of the receiving layer in these aspects of the invention is to inhibit spreading of the composition that is deposited to form the conductive feature rather than to etch the passivation layer. Line widths that are less than 200 μm, e.g., less than 100 μm, less than 75 μm or less than 50 μm, may be achieved according to this aspect of the invention. These line thicknesses are also achievable with rigid silicon wafer substrates.

Surface Modifying Material

The process of the present invention, in some embodiments, comprises the deposition of a surface modifying material onto at least a portion of a substrate before the deposition of the composition described above. One of the functions of the surface modifying material is to inhibit spreading of the composition after it is deposited on the substrate. Spreading of the composition is inhibited for example, by electrostatic interactions between the surface modifying material and either or both the metallic nanoparticles and/or the metal precursor to the metal and the surface modifying material (as indicated above, either or both may be present in the composition). Such electrostatic interactions, as discussed in greater detail below, preferably cause the metallic nanoparticles to flocculate. When the composition comprises a metal precursor to the metal, such electrostatic interactions can cause metal to precipitate from the metal precursor to the metal. In this aspect, the surface modifying material may act as a reducing agent which facilitates the conversion of the metal precursor to the metal. Optionally, the surface modifying material comprises chemical components (e.g., salts and ceramic particles) that etch the passivation layer following an appropriate treatment (e.g., heating). Such chemical components will be referred to hereinafter as etchants. When the surface modifying material etches the passivation layer, it forms an etched region and the composition is optionally deposited on this etched region. Accordingly, once the photovoltaic feature is formed from the composition, the feature is in electrical contact with the underlying layer, e.g., n-silicon layer. In some embodiments, e.g., where the receiving layer etches the substrate prior to deposition of the composition, the boundaries or walls of the etched region preferably inhibit the composition from spreading. Thus, as indicated above, according to some embodiments of the present invention, either or both the surface modifying material and/or the composition etches through the passivation layer of the substrate.

The surface modifying material optionally comprises a salt or a plurality of salts. In some embodiments, the salt comprises ionic polymers (i.e., cationic and anionic polymers comprising an anionic or a cationic counter ion, respectively), cationic polymers being preferred. In one embodiment, the salt comprises an organic salt, preferably an organic salt comprising fluoride. Examples include trifluoro acetic acid (TFA), hexafluoroacetylacetone (HFAC), phosphate containing, carboxylate and sulfonate fluorosurfactant materials such as those provided by both Dupont and 3M such as Fluorad™ and Zonyl™. Other phosphate containing materials include phosphates esters of alcohols and fatty alcohols. Exemplary cationic polymers contemplated by the invention include cationic polymers of polymers selected from the group consisting of polyethyleneimines, polyallylchlorides, ammonium salts of polyvinylpyrrolidone, or mixtures thereof. Alkyl ammonium salts such as tetracapryl ammonium may be used. In other embodiments, the salt comprises a non-polymeric salt. Exemplary non-polymeric include metal and non-metal salts which include trifluoromethane sulfonates, phosphates, nitrates, sulfates, and acetates. Exemplary sulfonates include sodium trifluoromethane sulfonate, ammonium trifluoromethane sulfonate, pyridinium trifluoromethane sulfonate, silver trifluoromethane sulfonate, trifluoroacetate. Exemplary phosphates include ammonium phosphate, di-hydrogen phosphate, and mono-hydrogen phosphate. Exemplary nitrates include silver nitrate, and salts of the above polymers. Exemplary acetates include trifluoro acetate, acetate salts of the above polymers, and ammonium acetate.

When the composition comprises metallic nanoparticles, the salt desirably can cause the metallic particles to flocculate. Flocculation of the metallic nanoparticles is desirable, in some instances, because it reduces the amount of spreading of the composition when the composition is deposited on at least a portion of the surface modifying material. Metallically denser photovoltaic features have lower porosity, which leads to low line resistance in the photovoltaic feature.

When the composition comprises a metal precursor to the metal, the salt from the receiving layer can cause metal to precipitate from the metal precursor. The metal may form as a result of a thermal decomposition of the metal precursor. Thus, in this aspect, the salt may act as a reducing agent to the metal precursor. Precipitation of the metal from the metal precursor to the metal is desirable, in some instances, because it inhibits spreading of the composition containing the metal precursor as well as because it forms the conductive phase which forms the desired conductive feature, e.g., grid electrode pattern.

In some embodiments, the salt is capable of producing a byproduct that etches the passivation layer. The byproduct can be produced by heating the surface modifying material under conditions effective to produce the byproduct that, in turn, etches the passivation layer. The heating of the surface modifying material can occur prior to the step of depositing the composition (but after deposition of the surface modifying material) or in a step that is subsequent to depositing the composition. Alternatively, the heating of the surface modifying material, optionally, occurs simultaneously with the step of heating the composition that causes the composition to form at least a portion of a photovoltaic conductive feature. In some embodiments, the surface modifying material is heated (e.g., with a furnace, a light source, such as a heat lamp, and/or lasers) to a temperature from about 50° C. to about 300° C., e.g., from about 100° C. to about 200° C., from about 100° C. to about 150° C., to form the byproduct. Temperatures greater than 300° C. are also possible, for example for fluorinated materials, such as from about 300 to about 600° C.

While not being bound by any particular theory, when the surface modifying material comprises a fluorine- or a phosphate-containing salt, it is believed that upon heating of the surface modifying material, a byproduct such as fluoride or phosphoric acid is produced, respectively. The fluoride or the phosphoric acid byproduct can, in some circumstances, etch the passivation layer. Exemplary fluoride-containing salts are listed above, and non-limiting examples of phosphate-containing salts include any of the phosphates listed above.

In an additional embodiment the surface modifying material may be a polymeric material. Such materials could be applied as emulsions, lacquers, enamels, and can thermoplastic or thermally cross-linked where the main function is to create an appropriate coating, thereby modifying the surface in preparation for printing the composition. This surface modify polymer formulation optionally comprises and etchant (e.g., salts and/or ceramic particles). Materials are preferably selected from the group of acrylates, epoxies, vinyl, polyesters, siloxanes, or any polymer coating either printed by a direct-write method or coated by means known to the art.

In alternative embodiments, the surface modifying material comprises a UV-curable material. The UV-curable material preferably is selected from the group consisting of acrylates, methacrylates, vinyl ethers, and epoxies. The UV-curable material optionally comprises an etchant (e.g., salts and/or ceramic particles). The UV-curable material may be cured by using a source of ultraviolet light having a wavelength of from about 250 nm to about 400 nm. The cured material preferably has a surface energy suitable for inhibiting spreading of the composition once it is deposited. If the UV-curable material comprises an etchant, after the material is cured, the material is optionally heated under conditions effective to etch the passivating layer. As the cured material is heated, the etchant etches the passivating layer to form an etched region. The composition can then optionally be deposited on the etched region. Accordingly, once the photovoltaic feature is formed from the composition, the feature is in electrical contact with the underlying layer, e.g., n-silicon layer.

In a further embodiment, the UV-durable ink may contain conductor and/or etchant materials such that through consecutive printing and curing, the thickness of the printed layer can be increased without significantly increasing the line width of feature spreading.

In another embodiment, the surface of the substrate may be modified by reaction with a molecule that reacts to form a surface termination with the available surface function groups. An example of such as reaction is the reaction with surface hydroxyl (—OH), amine (—$NH_2$) or imine (—NH) groups with a silylating agent such as hexamethyldisilazane, trimethylsilyl chloride, trimethylsilylaminde to form bonded surface trimethylsilyl groups. The change in surface termination from a polar surface functional group (such as hydroxide) to a non-polar surface functional group changes the surface characteristics from hydrophobic to hydrophilic, thereby improving the wetting of a low viscosity ink comprising metal and/or etchant particles or functionality. This surface modification can be carried out in a number of different methods such as by exposure of the substrate to the surface modification reagent in the gas phase (i.e. through a gaseous molecule, solid surface reaction), or the surface modification reagent could be delivered as a liquid, either pure or in solution.

In various embodiments, the surface modifying material of the present invention, whether it is a salt or a UV-curable material, can remain once the photovoltaic conductive feature is formed, can be removed during the process that forms the feature, or can be removed subsequent to the formation of the feature. For example, a composition comprising metallic nanoparticles and/or a metal precursor to the metal can be deposited onto at least a portion of a surface modifying material comprising a relatively volatile salt (e.g., ammonium acetate). Subsequently, the substrate can be treated under conditions effective for the formation of the photovoltaic conductive feature (e.g., heating) and/or for etching of the substrate (e.g., by an etchant present either in the composition and/or in the surface modifying material). The same conditions that are effective for the formation of the photovoltaic feature and/or for etching of the substrate can cause the removal of the surface modifying material by, e.g., volatilization, thus leaving a substrate, comprising a photovoltaic conductive feature, which substrate can be substantially free of the surface modifying material.

Photovoltaic Conductive Feature: Formation and Properties

After deposition onto a substrate, the composition comprising the metallic nanoparticles and/or the metal precursor to the metal is treated such that the composition forms at least a portion of a photovoltaic conductive feature. The treatment can include multiple steps, or can occur in a single step, such as when the composition is rapidly heated and held at the conversion temperature for a sufficient amount of time to form the photovoltaic conductive feature. Heating can be accomplished using furnaces, light sources such as heat lamps and/or lasers. The photovoltaic conductive feature can be post-treated after its formation. For example, the crystallinity of the phases present can be increased, such as by laser processing. The post-treatment can also include cleaning and/or encapsulation of the electronic features, or other modifications.

In one aspect, the surface modifying material is treated, e.g., heated or subjected to UV radiation (if the surface modifying material is UV curable), before the composition is deposited, and the composition is treated, e.g., heated, in a subsequent treating step. In another embodiment, the surface modifying material is deposited and the composition is deposited without an intervening treating, e.g., heating step. In this latter embodiment, the treating, e.g., heating, step preferably occurs after both the surface modifying material and the composition are deposited. Accordingly, in this aspect, both the surface modifying material and the composition are heated in a single heating step.

In some embodiments, the treatment that forms the photovoltaic conductive feature and/or that causes the etching of the substrate by an etchant involves heating the composition to a temperature from about 400° C. to about 1000° C., e.g., from about 700° C. to about 1000° C., from about 750° C. to about 900° C., to form the photovoltaic conductive feature on the substrate and/or to etch the substrate. Heating of the composition at the aforementioned temperatures preferably causes the metallic nanoparticles to sinter, thus affording a uniform dense metal phase. When the particles comprise a ceramic material, the resulting photovoltaic feature comprises not only a percolation network of metallic particles, but also a ceramic material. When the composition comprises a metal precursor to the metal, heating the composition at the aforementioned temperatures causes the metal to form, thus affording the photovoltaic feature.

In some embodiments the photovoltaic conductive feature is deposited on a substrate that comprises a layer, e.g., a passivating layer such as a silicon nitride layer on a n-silicon wafer, that can be etched by the ceramic material present on the metallic nanoparticles during the heating of the composition.

When the particles comprise a ceramic material, the compositions and processes of the invention provide the ability to form photovoltaic features having a lower ceramic content than in conventional photovoltaic conductive features. In preferred embodiments, the ceramic material is present in the conductive feature in an amount less than 10 wt. %, e.g., less than 5 wt %, less than 2 wt %, and less than 1 wt %. As a result of the comparatively low ceramic content, the compositions and processes of the invention provide the ability to form photovoltaic conductive features having improved conductivity over conventional photovoltaic conductive features. For example, in some exemplary preferred embodiments, the percolation network has a resistance that is less than five times the bulk resistance of the metal, e.g., less than three times, less than two times, or less than one and a half times the bulk resistance of the metal. In some embodiments, the percolation network has a resistance that is less than 8 $\mu\Omega\cdot cm$, e.g., less than 5 $\mu\Omega\cdot cm$, or less than 2 $\mu\Omega\cdot cm$.

In some embodiments according to the present invention, the conductive feature has a thickness greater than 0.5 $\mu m$, e.g., greater than 1 $\mu m$ or greater than 5 $\mu m$. Such thick conductive features may be formed, for example, by printing the composition in multiple passes. In other embodiments, the conductive feature has a thickness of from about 50 nm to about 1 $\mu m$, e.g., from about 50 nm to about 200 nm, and from about 100 nm to about 500 nm. In some embodiments, the conductive feature comprises a set of finger lines and bus bars deposited essentially at a right angle to the finger lines. When certain printing processes are employed (e.g., ink jet printing processes), conductive features may be formed having comparatively thin line widths. In some embodiments, for example, either or both the parallel finger lines or the collector lines have a width less than 200 $\mu m$, less than 100 $\mu m$, or less than 50 $\mu m$.

The metal comprised in the photovoltaic conductive features of the embodiments of the present invention, whether it comes from metallic nanoparticles and/or from a metal precursor to the metal, optionally is selected from silver, copper, gold, palladium, platinum, nickel, cobalt, zinc, molybdenum, tungsten, ruthenium, titanium, and alloys thereof. In some embodiments, the metal is selected from ruthenium, titanium, and alloys thereof. When the particles comprise a ceramic material, the ceramic material comprised in the photovoltaic conductive features of the embodiments of the present invention is selected the ceramic material comprises a mixture of a plurality of metal oxides, e.g., an oxide of at least one element selected from silicon, zinc, zirconium, aluminum, titanium, ruthenium, tin and cerium. In other embodiments, the ceramic material comprises two or more oxides of at least one element selected from silicon, zinc, zirconium, aluminum, titanium, ruthenium, tin and cerium. In still other embodiments, the ceramic material comprises an oxide of at least one element selected from lead, strontium, sodium, calcium, bismuth, phosphorus, and boron. In other embodiments, the ceramic material comprises two or more oxides of at least one element selected from lead, strontium, sodium, calcium, bismuth, phosphorus, and boron. Preferably, the metal comprised in the photovoltaic features comprises silver and the ceramic material comprises silica, bismuth, or lead.

Depending on the nature of the metallic nanoparticles and the nature of the metal precursor to the metal (when present) conductive features, other than photovoltaic conductive features, can be made using the processes described herein. Thus, for example, the processes of the present invention can be employed to produce conductive features that can be used in optical, electronic, display, and fuel cell applications. See, e.g., U.S. Ser. No. 11/443,131 filed May 31, 2006, U.S. Ser. No. 11/331,231 filed Jan. 13, 2006, U.S. Ser. No. 11/331,186 filed Jan. 13, 2006, U.S. Ser. No. 11/331,237 filed Jan. 13, 2006, U.S. Ser. No. 11/331,190 filed Jan. 13, 2006, U.S. Ser. No. 11/331,239 filed Jan. 13, 2006, U.S. Ser. No. 11/331,187 filed Jan. 13, 2006 and U.S. Ser. No. 10/265,179 filed Oct. 4, 2002, all of which are fully incorporated herein by reference.

While the present invention has been described and illustrated by reference to particular embodiments, those of ordinary skill in the art will appreciate that the invention lends itself to variations not necessarily illustrated herein. For this reason, then, reference should be made solely to the appended claims for purposes of determining the true scope of the present invention.

What is claimed is:

1. A process for forming a photovoltaic conductive feature, comprising:
   providing a substrate comprising a passivation layer disposed on a silicon layer;
   depositing a surface modifying material comprising a UV-curable material on at least a portion of the passivation layer;
   curing the UV-curable material to form a cured material;
   depositing a composition comprising at least one of metallic nanoparticles comprising a metal or a metal precursor to the metal onto at least a portion of the cured material; and
   heating the cured material and the composition such that at least one of the cured material or the composition etches a region of the passivation layer and such that the composition forms at least a portion of a photovoltaic conductive feature that is in electrical contact with the silicon layer.

2. The process of claim 1 wherein the composition comprises the metallic nanoparticles.

3. The process of claim 1 wherein the composition is substantially free of metallic nanoparticles.

4. The process of claim 1 wherein the composition comprises the metal precursor, and the metal precursor comprises an anion and the anion etches the passivation layer.

5. The process of claim 1 wherein the surface modifying material etches the passivation layer.

6. The process of claim 1 wherein the cured material inhibits spreading of the composition.

7. The process of claim 1 wherein the metal is selected from the group consisting of silver, copper, gold, palladium, platinum, nickel, cobalt, zinc, molybdenum, tungsten, ruthenium, titanium, and alloys thereof.

8. The process of claim 1 wherein the metallic nanoparticles comprise a continuous or noncontinuous cap or coating thereon.

9. The process of claim 8 wherein the cap or coating comprises an organic cap or coating.

10. The process of claim 8 wherein the cap or coating comprises a polymer.

11. The process of claim 8 wherein the cap or coating comprises an intrinsically conductive polymer, a sulfonated perfluorohydrocarbon polymer, polystyrene, polystyrene/ methacrylate, sodium bis(2-ethylhexyl) sulfosuccinate, tetra-n-octyl-ammonium bromide or an alkane thiolate.

12. The process of claim 8 wherein the cap or coating comprises PVP.

13. The process of claim 8 wherein the cap or coating comprises a ceramic material.

14. The process of claim 13 wherein the ceramic material comprises a mixture of a plurality of metal oxides.

15. The process of claim 13 wherein the ceramic material comprises an oxide of at least one of silicon, zinc, zirconium, aluminum, titanium, ruthenium, tin, cerium, lead, strontium, sodium, calcium, bismuth, boron, lithium and phosphorous.

16. The process of claim 13 wherein the metal comprises silver and the ceramic material comprises glass.

17. The process of claim 1 wherein at least one of the surface modifying material and the composition further comprises ceramic particles.

18. The process of claim 17 wherein the ceramic particles comprise a mixture of a plurality of metal oxides.

19. The process of claim 17 wherein the ceramic particles comprise an oxide of at least one of silicon, zinc, zirconium, aluminum, titanium, ruthenium, tin, cerium, lead, strontium, sodium, calcium, bismuth, boron, lithium and phosphorous.

20. The process of claim 1 wherein the cured material comprises an etchant that etches the passivating layer to form an etched region and wherein the composition is deposited on the etched region.

21. The process of claim 1 wherein the heating comprises heating the cured material and the composition to a temperature not greater than 1000° C.

22. The process of claim 1 wherein the photovoltaic conductive feature comprises a set of finger lines and bus bars deposited essentially at a right angle to the finger lines.

23. The process of claim 22 wherein the parallel finger lines have a width less than 100 μm.

24. The process of claim 1 wherein the photovoltaic conductive feature has a thickness greater than 5 μm.

25. The process of claim 1 wherein the UV-curable material is selected from the group consisting of acrylates, methacrylates, vinyl ethers, and epoxies.

26. A process for forming a photovoltaic conductive feature, comprising:
    providing a substrate comprising a passivation layer disposed on a silicon layer;
    depositing a surface modifying material comprising a UV-curable material on at least a portion of the passivation layer;
    depositing a composition comprising at least one of metallic nanoparticles comprising a metal or a metal precursor to the metal onto at least a portion of the UV-curable material;
    curing the UV-curable material to form a cured material; and
    heating the UV-curable material and the composition simultaneous with the curing such that at least one of the cured material or the composition etches a region of the passivation layer and such that the composition forms at least a portion of a photovoltaic conductive feature that is in electrical contact with the silicon layer.

* * * * *